(12) United States Patent
Kraemer

(10) Patent No.: US 10,575,449 B1
(45) Date of Patent: Feb. 25, 2020

(54) COMBINED HIGH FREQUENCY EMI SHIELD AND SUBSTRATE HEATER USING A THIN FILM

(71) Applicant: Rockwell Collins, Inc., Cedar Rapids, IA (US)

(72) Inventor: John G. Kraemer, Marion, IA (US)

(73) Assignee: ROCKWELL COLLINS, INC., Cedar Rapids, IA (US)

(*) Notice: Subject to any disclaimer, the term of this patent is extended or adjusted under 35 U.S.C. 154(b) by 48 days.

(21) Appl. No.: 15/626,608

(22) Filed: Jun. 19, 2017

(51) Int. Cl.
*H05K 9/00* (2006.01)
*H05K 7/20* (2006.01)

(52) U.S. Cl.
CPC ............. *H05K 9/0086* (2013.01); *H05K 7/20* (2013.01)

(58) Field of Classification Search
CPC .............................. H05K 9/0086; H05K 7/20
See application file for complete search history.

(56) References Cited

U.S. PATENT DOCUMENTS

| | | | | |
|---|---|---|---|---|
| 4,119,425 A * | 10/1978 | Marriott | ................... | H05B 3/84 65/107 |
| 4,682,007 A * | 7/1987 | Hollander | ............... | A42B 3/245 2/435 |
| 5,403,616 A * | 4/1995 | Hattori | ..................... | H05B 3/84 427/126.3 |
| 5,500,953 A * | 3/1996 | Reuber | .................. | A42B 3/226 2/15 |
| 5,838,111 A * | 11/1998 | Hayashi | ............ | H01J 37/32082 315/111.21 |
| 6,317,248 B1 * | 11/2001 | Agrawal | ................. | G02F 1/155 340/438 |
| 7,335,421 B2 * | 2/2008 | Thiel | ................ | B32B 17/10036 428/428 |
| 7,372,611 B2 * | 5/2008 | Tonar | ....................... | B60R 1/08 359/265 |
| 8,411,348 B2 * | 4/2013 | Valentin | ................. | G02F 1/155 359/265 |
| 8,791,394 B2 * | 7/2014 | Han | ........................ | H05B 3/84 219/202 |
| 9,015,868 B2 * | 4/2015 | Matsumoto | ........... | G02C 11/08 2/435 |
| 9,568,799 B2 * | 2/2017 | Lam | ......................... | E06B 9/24 |
| 9,596,719 B2 * | 3/2017 | Offermann | ....... | B32B 17/10036 |

(Continued)

*Primary Examiner* — David M Sinclair
*Assistant Examiner* — Theron S Milliser
(74) *Attorney, Agent, or Firm* — Donna P. Suchy; Daniel M. Barbieri

(57) ABSTRACT

A device including a controller, an EMI shield and heater assembly, and an electrically conducting chassis. The EMI shield and heater assembly has a conductive layer and a plurality of conductive input lines. The conductive layer is divided into a plurality of cells, which are connected to adjacent cells via conductive layer material and have a cut in the conductive layer material between adjacent cells. The plurality of conductive input lines are connected to respective of the voltage outputs and electrically contact only a first group of cells. The controller is configured to provide respective voltages to the first group of cells to heat regions of the conductive layer. The electrically conducting chassis is electrically connected to a second group of cells, and electrically isolated from the first group of cells. None of the cells in the first group of cells are adjacent to each other.

19 Claims, 6 Drawing Sheets

(56) References Cited

U.S. PATENT DOCUMENTS

| | | | |
|---|---|---|---|
| 2005/0045613 A1* | 3/2005 | Maeuser | B32B 17/10036 219/203 |
| 2006/0138123 A1* | 6/2006 | Ishii | H01C 1/01 219/549 |
| 2007/0221646 A1* | 9/2007 | Shin | H05B 3/84 219/219 |
| 2010/0202127 A1* | 8/2010 | Tuominen | H01L 24/19 361/818 |
| 2011/0211246 A1* | 9/2011 | Agrawal | G02F 1/161 359/267 |

* cited by examiner

COMBINED HIGH FREQUENCY EMI SHIELD AND SUBSTRATE HEATER USING A THIN FILM

The inventive concepts disclosed herein generally relate to the field of displays and sensor windows with Electromagnetic Interference (EMI) shields and/or substrate heaters.

BACKGROUND

Vision sensors and displays are often used in adverse environments. For example, such sensors and displays may be used in cold conditions, where icing occurs on portions of the front of the sensor or display, and/or a low surface temperature may prevent the proper operation of electronics at the window or display image producing mechanism. Conductive thin films may be used for heating the sensor or display to increase surface temperature and/or prevent the formation of ice. When used for heating, an electrical current is run through the thin film. The thin film for heating is often cut into serpentine strips, or left as a single sheet, where heating current flows from the top to bottom of the display, or from left to right. Further, the conductive thin film may be located only around the perimeter of the display or window area, as that is where, due to thermal physics, most of the heat is often needed to be applied.

The sensors and displays may also be in an adverse environment where electrical components of the displays, enclosed sensors and/or enclosed electronics are subject to undesired electromagnetic energy, which can produce EMI. The sensors and displays may also need to prevent the radiation of electromagnetic energy that is sourced by the active electronics they contain to ensure compliance with applicable EMI emissions standards and to prevent interference to radio receivers. Conductive thin films may also be used to provide EMI shielding. In the case that both heating and EMI shielding is needed, the serpentine strip, perimeter only, and single sheet arrangements have long non-conductive openings associated with the conductive thin film, and in the case of the perimeter-only heater, a large non-conductive area in the center. In these cases the thin film provides very little EMI shielding at high frequencies. Thus, if both EMI shielding and heating are needed, two thin films are typically used for the sensor and displays, one film for heating, and another for EMI shielding. Such a design, however, requires the added complexity and cost of two thin films, as well as reducing the transmission of light and infrared energy and introducing distortion into these spectra.

SUMMARY

In one aspect, embodiments of the inventive concepts disclosed herein are directed to a device. The device includes a controller, an EMI shield and heater assembly, and an electrically conducting chassis. The controller is arranged to receive a power input and has a plurality of voltage outputs. The EMI shield and heater assembly has a conductive layer and a plurality of conductive input lines. The conductive layer is divided into a plurality of cells. The cells are connected to adjacent cells via conductive layer material and have a cut in the conductive layer material between adjacent cells. The plurality of cells include a first group of cells and a second group of cells in an outer peripheral region of the conductive layer. The plurality of conductive input lines are connected to respective voltage outputs and electrically contact only the first group of cells. The controller is configured to provide respective voltages to the first group of cells to heat regions of the conductive layer. The voltages provided to each individual cell in the first group may be different in level, duration, and time of application when compared to the others in order to provide the desired heat distribution. The electrically conducting chassis is electrically connected to the second group of cells, and electrically isolated from the first group of cells at the periphery of the conductive layer. None of the cells in the first group of cells are adjacent to each other.

In a further aspect, embodiments of the inventive concepts disclosed herein are directed to an electronic device. The electronic device includes electronic components, a controller, an EMI shield and heater assembly, and an electrically conducting chassis. The controller is arranged to receive a power input and has a plurality of voltage outputs. The EMI shield and heater assembly has a conductive layer and a plurality of conductive input lines. The conductive layer is divided into a plurality of cells. The cells are connected to adjacent cells via conductive layer material and have a cut in the conductive layer material between adjacent cells. The plurality of cells include a first group of cells and a second group of cells in an outer peripheral region of the conductive layer. The plurality of conductive input lines are connected to respective of the voltage outputs and electrically contact only the first group of cells. The controller is configured to provide respective voltages to the first group of cells to heat regions of the conductive layer. The voltages provided to each individual cell in the first group may be different in level, duration, and time of application when compared to the others in order to provide the desired heat distribution. The electrically conducting chassis is electrically connected to the second group of cells, and electrically isolated from the first group of cells at the periphery of the conductive layer. None of the cells in the first group of cells are adjacent to each other.

In a further aspect, embodiments of the inventive concepts disclosed herein are directed to a device. The device includes a controller, a heater, and a plurality of conductive input lines. The controller is arranged to receive a power input and has a plurality of voltage outputs. The heater includes a conductive layer divided into a plurality of cells, the cells are connected to adjacent cells via conductive layer material. The plurality of conductive input lines are connected to respective of the voltage outputs and electrically contact cells in an outer peripheral region of the conductive layer. The voltages provided to each individual cell in the first group may be different in level, duration, and time of application when compared to the others in order to provide the desired heat distribution. The controller is configured to provide respective voltages to a first group of cells of the cells in the outer peripheral region to heat regions of the conductive layer.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function.

FIG. 1 illustrates a device including an EMI shield and heater assembly according to inventive concepts disclosed herein.

FIG. 2 illustrates an electronic device incorporating the device of FIG. 1 according to inventive concepts disclosed herein.

FIG. 3 is a schematic illustrating a controller and conductive layer according to inventive concepts disclosed herein.

FIG. 4 illustrates a worst case electromagnetic shielding model for the conductive layer and an electrically conductive chassis according to inventive concepts disclosed herein.

FIG. 5 illustrates an equivalent electrical circuit model for the arrangement of FIG. 3 according to inventive concepts disclosed herein.

FIG. 6 illustrates a cutaway portion of an EMI shield and heater assembly, according to inventive concepts disclosed herein.

FIG. 7 is an example output of the controller according to the inventive concepts disclosed herein.

DETAILED DESCRIPTION

Embodiments of the inventive concepts disclosed herein regarding an EMI shield and heater assembly provide a single conductive layer for both heating and EMI shielding. The single conductive layer, which could be a thin film or wire mesh, may together with an electrically conductive chassis form an enclosure which surrounds electronic components and acts as an EMI shield. The size of the largest non-conductive region or feature in the conductive layer is kept relatively small so that higher frequency electromagnetic radiation is shielded.

Further, embodiments of the inventive concepts disclosed herein regarding a controller and temperature sensors for a heater allows for greater flexibility in temperature control. The controller may provide respective voltages to different regions of a conductive layer of the heater to allow for different heating for different regions. The controller may determine the voltages applied based on temperature sensors measuring the temperature of different regions on the chassis, the shield and heater assembly, and/or items inside the chassis.

Figure 1:
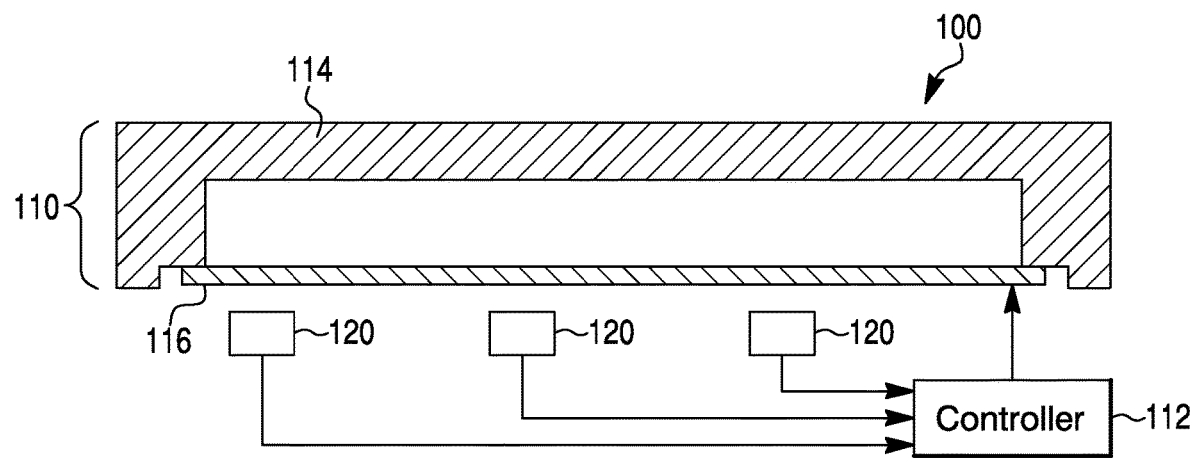
FIGS. 1 through 7 are general in regards to the shape and size of the opening needing shielding and heat, cell drive levels, as well as the granularity of the cell grid formed by the cutting of the conductive film. In the drawings.
Figure 2:
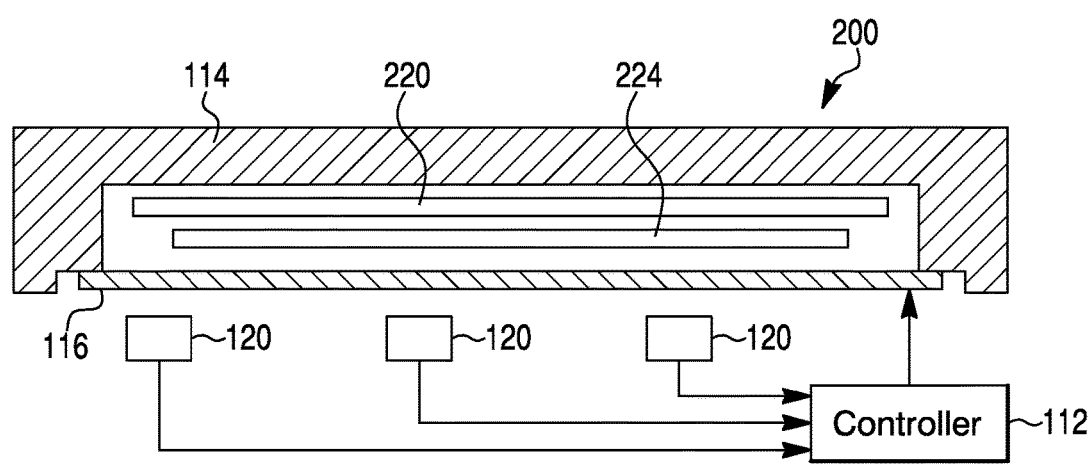

FIG. 1 illustrates an embodiment of a device 100 according to inventive concepts disclosed herein, while FIG. 2 illustrates an embodiment of an electronic device 200 employing the device 100 according to inventive concepts disclosed herein.

Referring to FIG. 1, the device 100 includes an EMI shield and heater assembly 110 and a controller 112. The EMI shield and heater assembly 100 comprises an electrically conductive chassis 114 and a conductive layer 116. The device may further include one or more temperature sensors 120. The temperature sensors 120 may be configured to measure the temperature of one or more regions of the device 100. The temperature sensors 120 may be any appropriate temperature sensor, such as infrared (IR) sensors which may remotely measure the temperature of a region of the electronic device 200 (FIG. 2), or resistive, thermocouple and/or semiconductor based sensors which contact the region where the temperature is to be measured.

Referring back to FIG. 2, the electronic device 200 comprises the device 100 of FIG. 1 and electronics 220. The electronic device 200 further may further include optics 224.

The electronically conductive chassis 114 and the conductive layer 116 together define an enclosure which surrounds the electronics 220. The enclosure defined by the electronically conductive chassis 114 and the conductive layer 116 acts as a faraday cage to reduce EMI from passing from outside to inside the enclosure and from inside to outside the enclosure.

The electronics 220 could include, for example, electromagnetic (e.g. visible light, infrared radiation, and ultraviolet radiation) detectors and supporting electronics; for example, such as in the case the electronic device 200 is an optical and infrared sensor, such as would be used for a synthetic vision system. The optics 224 could include, for example, focusing optics to focus electromagnetic radiation of interest onto the electromagnetic detectors. The optics 224, could also include a transparent plate to support the conductive layer 116. The transparent plate could be formed of glass, sapphire, quartz, plastic, or germanium, depending on the electromagnetic radiation of interest to pass through the transparent plate. The electromagnetic radiation of interest may in the ultraviolet (UV), visible, near infrared (NIR), infrared (IR), or in other regions of the electromagnetic spectrum.

While FIG. 2 illustrates the controller 112 being outside the enclosure defined by the electronically conductive chassis 114 and the conductive layer 116, alternatively, and typically more appropriate, the controller 112 may be inside the enclosure. Similarly, while FIG. 2 illustrates the temperature sensors 120 being outside the enclosure defined by the electronically conductive chassis 114 and the conductive layer 116, alternatively some or all of the temperature sensors 120 may be inside the enclosure. Further, while FIG. 2 illustrates the optics 224 being inside the enclosure defined by the electronically conductive chassis 114 and the conductive layer 116, alternatively the optics 224 may be outside the enclosure, or a portion of the optics 224 may be inside the enclosure and a portion may be outside the enclosure. Whether or not the temperature sensors 120 or the controller 112 are outside or inside the enclosure may depend on whether EMI shielding is deemed warranted to shield the temperature sensors 120 or the controller 112.

Figure 3:
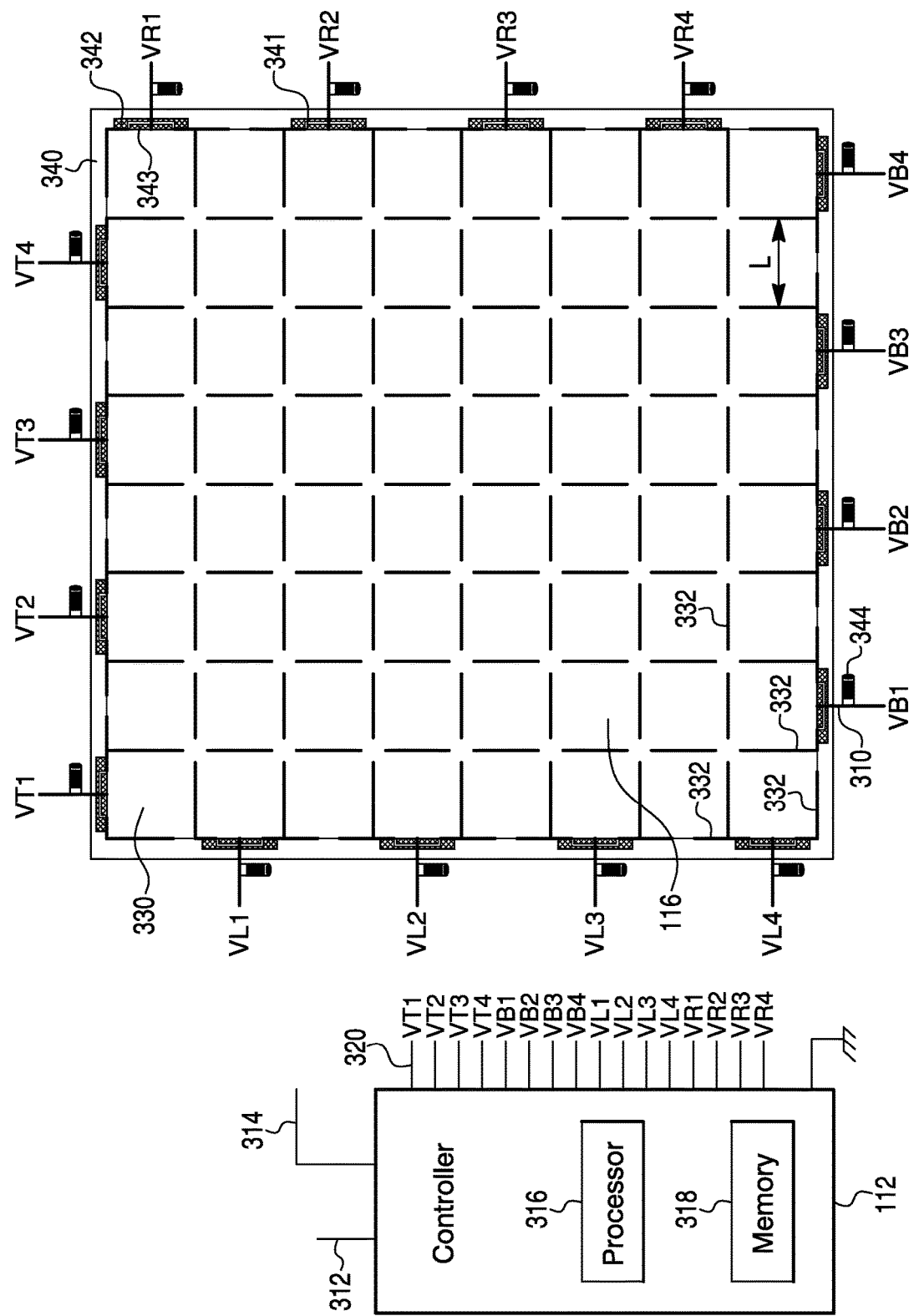

FIG. 3 is a schematic illustrating the controller 112, conductive layer 116, and conductive layer input lines 310 in more detail according to inventive concepts disclosed herein. The controller 112 may include a power input 312 and one or more temperature sensor inputs 314. The power input 312 is connected to power source, such as a DC or AC power source. The temperature sensor inputs 314 are connected respectively to the temperature sensors 120 (see FIG. 1). The controller 112 may include a processor 316 and a memory 318, where the memory stores code which is executed by the processor 316. The controller 112 may include a printed circuit board (not shown in FIG. 3).

The controller 112 further includes a plurality of voltage outputs 320. While FIG. 3 exemplarily illustrates sixteen outputs, in general the number of outputs may be more or less than sixteen. In FIG. 3, the voltage outputs are labeled $VT_i$, $VB_i$, $VL_i$ and $VR_i$, where i is an integer from 1 to 4, and T, B, L, and R correspond to the top, bottom, left and right, respectively, of the conductive layer 112. The voltage outputs 320 are connected to corresponding conductive layer input lines 310, so that voltages may be applied to respective cells 330 of the conductive layer. In this way, the conductive layer 116 may be heated by causing current to flow in the conductive layer 116.

The controller 112 may control the voltages applied to the conductive layer input lines 310 so as to provide heating of the conductive layer 116. The specific voltages applied may depend on the temperature of different regions of the electronic device 200 which are measured by respective of the temperature sensors 120, if present. In this way, the controller 112 provides flexibility in allowing for selectively heating different regions of the conductive layer.

Each output of the controller 112 may be a time varying sequence consisting of particular voltages and impedance state (when the voltage is zero) with respect to chassis, determined by the amount of heating needed for each cell. The output levels and timing may initially be computed mathematically based on the needed heating at each location and constraints for, and desired ranges of, the output voltages and the electrical characteristics (resistance) across cells, which will be a function of the thin film's conductivity and cell pattern and size.

Figure 7:
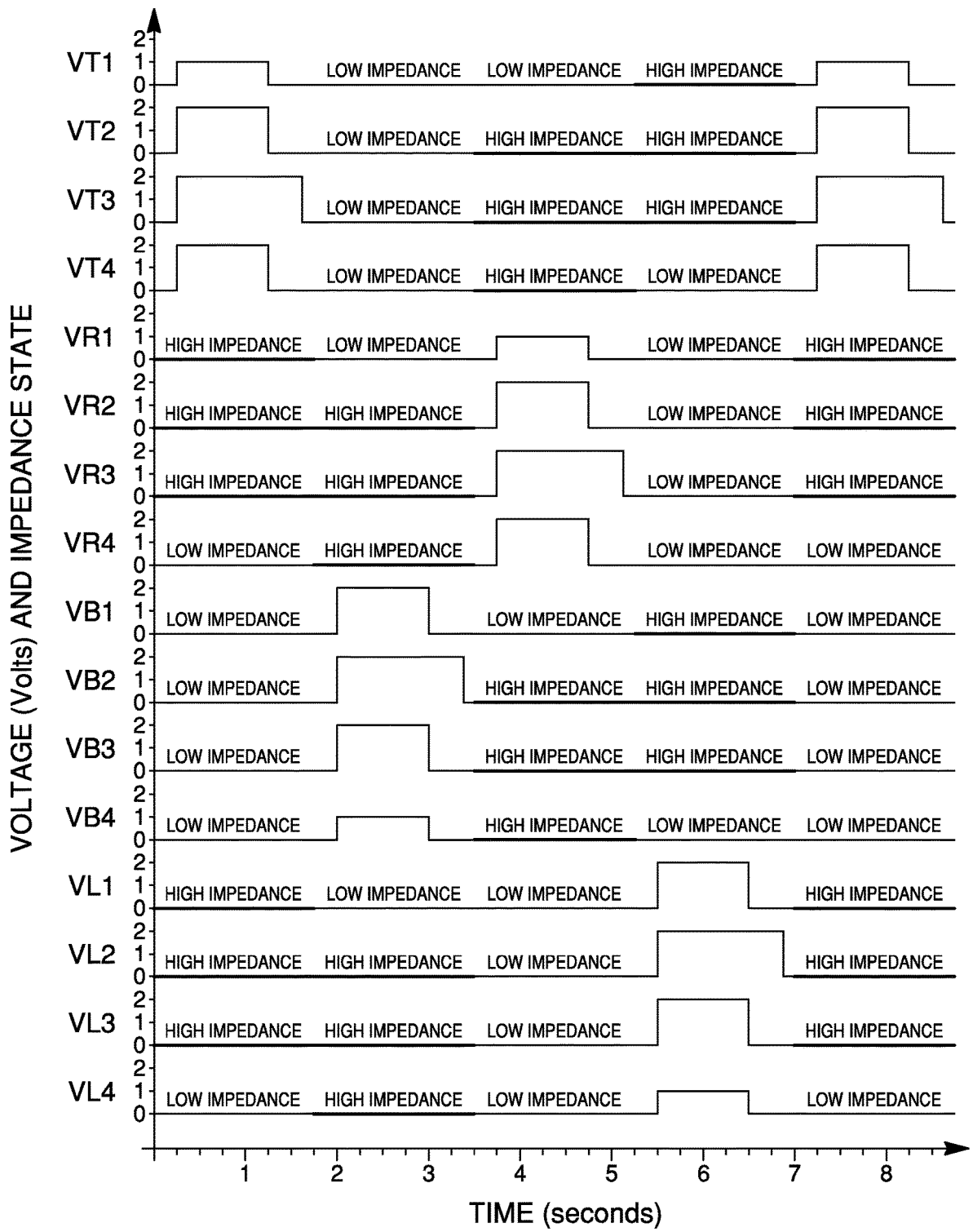

FIG. 7 is an example output of the controller 112 according to the inventive concepts disclosed herein. FIG. 7 illustrates an example of the voltage outputs for the outputs labeled VTi, VBi, VLi and VRi, where i is an integer from 1 to 4. In particular, FIG. 7 illustrates, as a function of time, both the voltage as well as the impedance state for each of the voltage outputs. The impedance state can be a high or low impedance state. Both the impedance state, as well as the voltage, is varied as a function of time for each of the voltage outputs.

Referring to FIG. 3, each of the conductive layer input lines 310 may be connected to a different voltage outputs 320. Alternatively, some of the conductive layer input lines 310 may be connected to a same of the voltage outputs 320. The number of voltage outputs 320 may be reduced since a voltage output 320 may be connected to more than one of the conductive layer input lines 310.

The conductive layer 116 may be a thin film. For example, the conductive layer 116 may be a thin film of indium tin oxide (ITO), gold splatter or silver. In the case that conductive layer 116 should function to pass light or other desired electromagnetic radiation into the electronic device 200 (see FIG. 2). The conductive layer material of the conductive layer 116 may be transparent or semi-transparent to the electromagnetic radiation which is desired to pass through the conductive layer 116. Alternatively, the conductive layer 116 may be a conductive mesh layer. The conductive mesh layer may be made of Monel metal or stainless steel, for example.

The conductive layer 116 is divided into a plurality of the cells 330. The cells 330 are connected to adjacent cells via conductive layer material. The conductive layer 116 also has cuts 332 in the conductive layer material between adjacent of the cells 330. As shown in FIG. 3, each of the cuts 332 in the conductive layer material does not extend all the way around a cell 330. Rather, as mentioned above, adjacent cells 330 are connected by conductive layer material.

The cells 330 include an outer peripheral region, which in embodiment of FIG. 3 includes the top row, bottom row, leftmost column and rightmost column of cells 330. While FIG. 3 illustrates an arrangement where the cells 330 are arranged in a two dimensional rectangular array with a bottom and top row, and a leftmost and right most column, in other cell arrangements the outer peripheral region need not be the top and bottom row and leftmost and rightmost column of cells 330. For example, the cells 330 may be arranged in a circular fashion with some of the cells being outermost from the center of the cells 330. In this circular arrangement, the outer peripheral region would be the cells 330 outermost from the center of the circle.

The plurality of cells includes a first group of cells and a second group of cells in the outer peripheral region of the conductive layer. The first group of cells are those cells 330 in the outer peripheral region which have a conductive layer input line 310, which is connected to a respective of the voltage outputs 320 of the controller 112. The second group of cells are those cells 330 in the outer peripheral region which do not have a conductive layer input line 310, which is connected to any of the voltage outputs 320 of the controller 112. The first and second group of cells together make up all of the cells in the outer peripheral region.

The first group of cells is electrically isolated from the electrically conductive chassis 114. For example, each of the first group of cells is electrically isolated from the electrically conductive chassis 114 by a respective insulating region 342, which may be of solid material or an air gap or vacuum. Each input line 310 passes through a respective insulating region 342 from a respective cell of the first group of cells, and is ultimately electrically connected to a voltage output 320 of the controller 112. Connection of an input line 310 to a cell of the first group may occur via a busbar section 343 of busbar 340 which mates with the shielding material on conductive layer 116 at its perimeter, whereby the busbar section 343 is electrically isolated from the rest of the busbar 340 via a cut 341 in the busbar 340 and cuts 332 in the shielding material on conductive layer 116 at its periphery. Insulating material in the insulating region 342 prevents input voltage provided by the input line 310 from shorting to the chassis 114.

On the other hand, the second group of cells is electrically connected to the electrically conductive chassis 114. For example, the second group of cells may be electrically connected to the electrically conductive chassis 114 via a busbar 340.

As discussed above, the enclosure defined by the electronically conductive chassis 114 and the conductive layer 116 acts as a faraday cage to reduce EMI passing from outside to inside the enclosure and from inside to outside the enclosure. The enclosure defined by the electronically conductive chassis 114 and the conductive layer 116, however, does include non-conductive discontinuities which may act to reduce the EMI shielding function of the enclosure at higher electromagnetic frequencies. The non-conductive discontinuities include the cuts 332 in the conductive layer and the insulating regions 342.

The length of the longest non-conductive discontinuity in the enclosure defined by the electronically conductive chassis 114 and the conductive layer 116 determines the highest frequency above which reduced EMI shielding results. For the arrangement shown in FIG. 3, where the cells 330 are square and have a side length L, the length of the longest non-conductive discontinuity is approximate 1.5×L. The non-conductive discontinuities are due to the cuts 332, which have lengths up to approximate 1.5×L, and to the insulating regions 342, which may have a length less than L in order to electrically isolate a respective cell of the first group of cells via a respective insulating region 342. In the arrangement none of the cells 330 in the first group of cells are adjacent to each other, so that none of the insulating regions 342 of adjacent cells connect to form a discontinuity greater than L.

For an arrangement where the longest non-conductive discontinuity is 1.5×L, EMI shielding will be limited to about 12 dB at a frequency equal to 1500/L MHz. As the frequency increases above a frequency of 1500/L MHz, the EMI shielding decreases quickly. As the frequency decreases, the EMI shielding will increase, generally at a rate of 20 to 40 dB per decade of frequency decrease provided that the electrical properties of the conductive layer 116 do not limit the EMI shielding.

As shown in FIG. 3, the device 100 may include a plurality of bypass capacitors 344, where each bypass capacitor 344 is arranged to electrically connect the electrically conductive chassis 114, and the conductive layer input lines 334. Each bypass capacitor 344 is arranged to contact a respective conductive layer input line 334 at a point near where the conductive layer input line 334 contacts the conductive layer 116. The bypass capacitors 344 provide electrical bonding of a contacted cell 330 to the electrically conductive chassis 114 at high frequencies, and thus help reduce EMI shielding degradation caused by the insulating regions 342 along the perimeter of the conductive layer 116.

Figure 4:
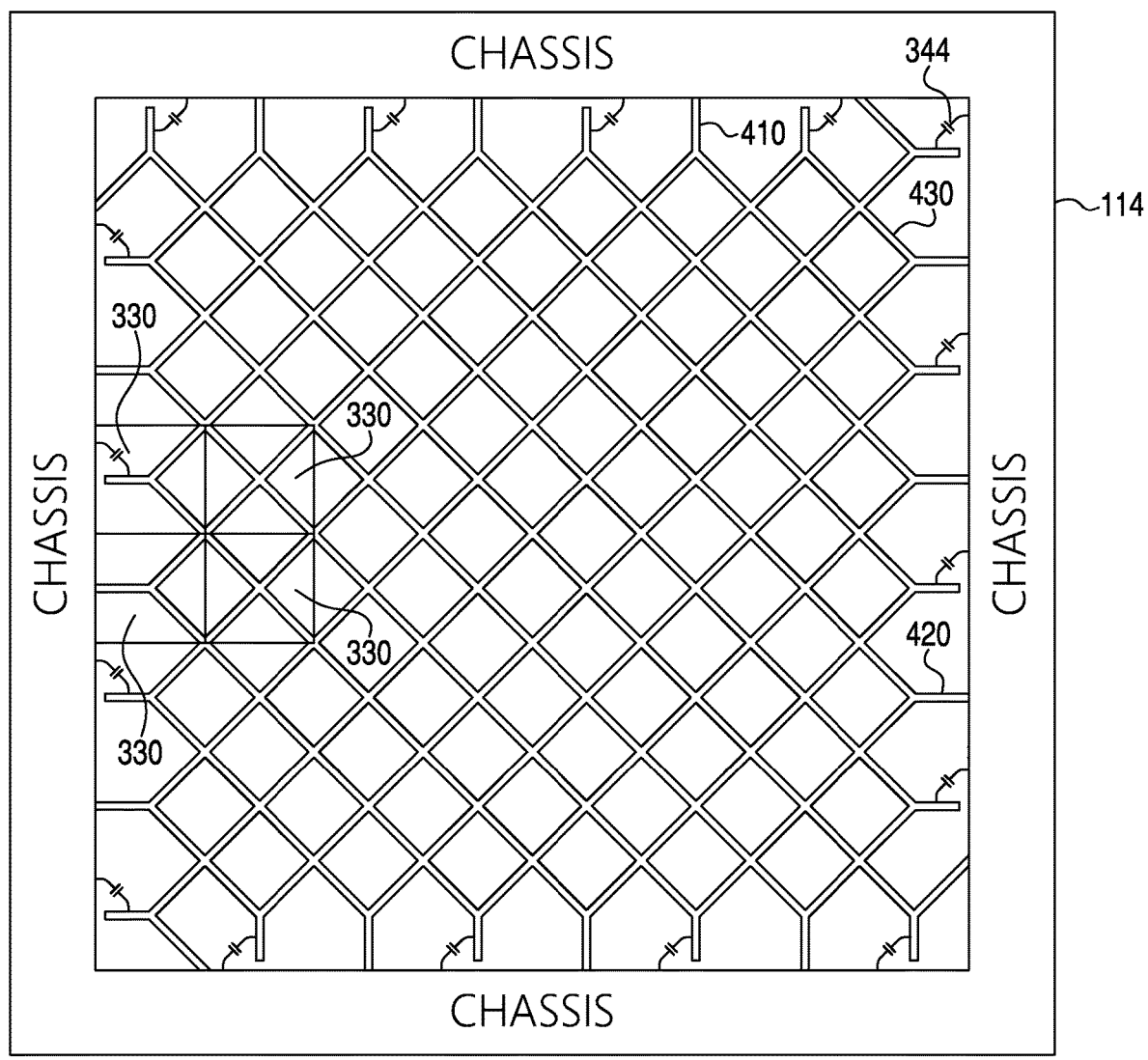

FIG. 4 illustrates an equivalent worst case electromagnetic shielding model for cells 330 of the conductive layer 116, electrically conductive chassis 114, and bypass capacitors 344. The vertical lines 410 and horizontal lines 420 and diagonal lines 430 in FIG. 4 show the electrical connection between cells 330 along a column and row of cells 330, respectively. Only four cells 330 are shown in FIG. 4 for the sake of simplicity, while FIG. 4 actually shows a worst case electromagnetic shielding model for an 8-by-8 array of cells 330. Each of the internal cells 330 is centered at an intersection of diagonal lines 430 as the cells 330 electrically connect at the corners. Connections of cell 330 around the periphery of conductive layer 116 have the electrical connection at the peripheral corner junction for allowing a wider area around the periphery to be heated. Of course, the cells 330 need not be arranged in an 8-by-8 array, and other sized arrays are contemplated. Further the cells 330 need not be arranged in a rectangular array, but may be arranged in circular fashion, for example. Further the cells 330 need not be square, but may be rectangular, for example. Further, the cells 330 need not be all of the same shape, but may have the outer cells square and the inner cells a combination of hexagon and triangular cells, for example. As mentioned in the discussion of FIG. 3, the highest frequency of shielding will be limited by the longest non-conductive discontinuity, which for square cells, is limited by dimension that is approximately 1.5×L (FIG. 3).

FIG. 4 illustrates each of the cells 330 is electrically connected to cells 330 which are vertically adjacent or horizontally adjacent. In particular, each of the cells 330 is electrically connected to cells 330 which are vertically adjacent or horizontally adjacent via the conductive layer material.

Further the cells 330 are separated into a first group of cells and a second group of cells as discussed above with respect to FIG. 3, where the first and second group of cells 330 together comprise all the cells in the outer peripheral region of the conductive layer 116. As shown, the first group of cells is electrically isolated from the electrically conductive chassis 114. Thus, the vertical line 410 or horizontal line 420 corresponding to one of the first group of cells does not directly contact the electrically conductive chassis 114. Rather, for a cell of the first group of cells, the corresponding vertical line 410 or horizontal line 420 is electrically connected to a bypass capacitor 344, which in turn is electrically connected to the electrically conductive chassis 114.

Further, as shown in FIG. 4, the second group of cells is electrically connected to the electrically conductive chassis 114. Thus, the vertical line 410 or horizontal line 420 corresponding to one of the second group of cells directly contacts the electrically conductive chassis 114.

Figure 5:
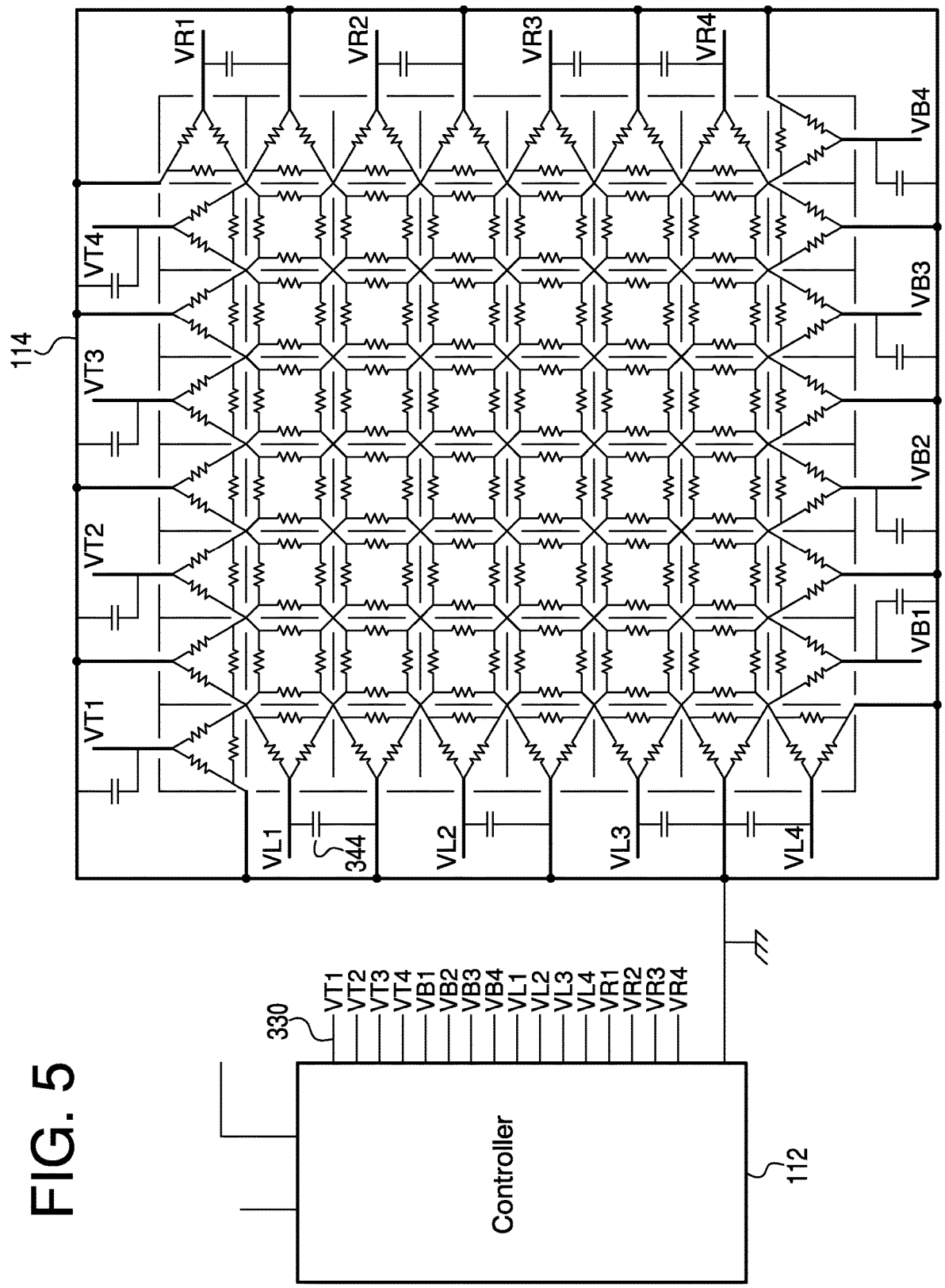

FIG. 5 illustrates an equivalent electrical circuit model for the arrangement of FIG. 3. FIG. 5 illustrates the electrically conductive chassis 114 and cells 330 of the conductive layer 116. As in FIG. 4, the cells 330 in FIG. 5 are arranged in an 8-by-8 array. Of course, the cells 330 need not be arranged in an 8-by-8 array, and other sized and/or shaped arrays are contemplated. Further the cells 330 need not be arranged in a square array, but may be arranged in circular fashion, for example.

In FIG. 5, in a similar fashion to FIG. 3, the cells include a first group of cells and a second group of cells in the outer peripheral region of the conductive layer. The first group of cells are those cells 330 in the outer peripheral region which have a voltage input line 334, which is connected to a respective of the voltage outputs 320 of the controller 112. The second group of cells are those cells 330 in the outer peripheral region which do not have a voltage input line 334, which is connected to any of the voltage outputs 320 of the controller 112. The second group of cells are electrically connected to the electrically conductive chassis 114. The first and second group of cells together make up all of the cells in the outer peripheral region of the conductive layer 116.

Each of the first group of cells is associated with a corresponding bypass capacitor 344, which is electrically connected to a respective voltage input line 334 at one end, and to the electrically conductive chassis 114 at the other end. The first group of cells is arranged so that none of the cells 330 of the first group of cells is adjacent any other cell of the first group of cells.

Figure 6:
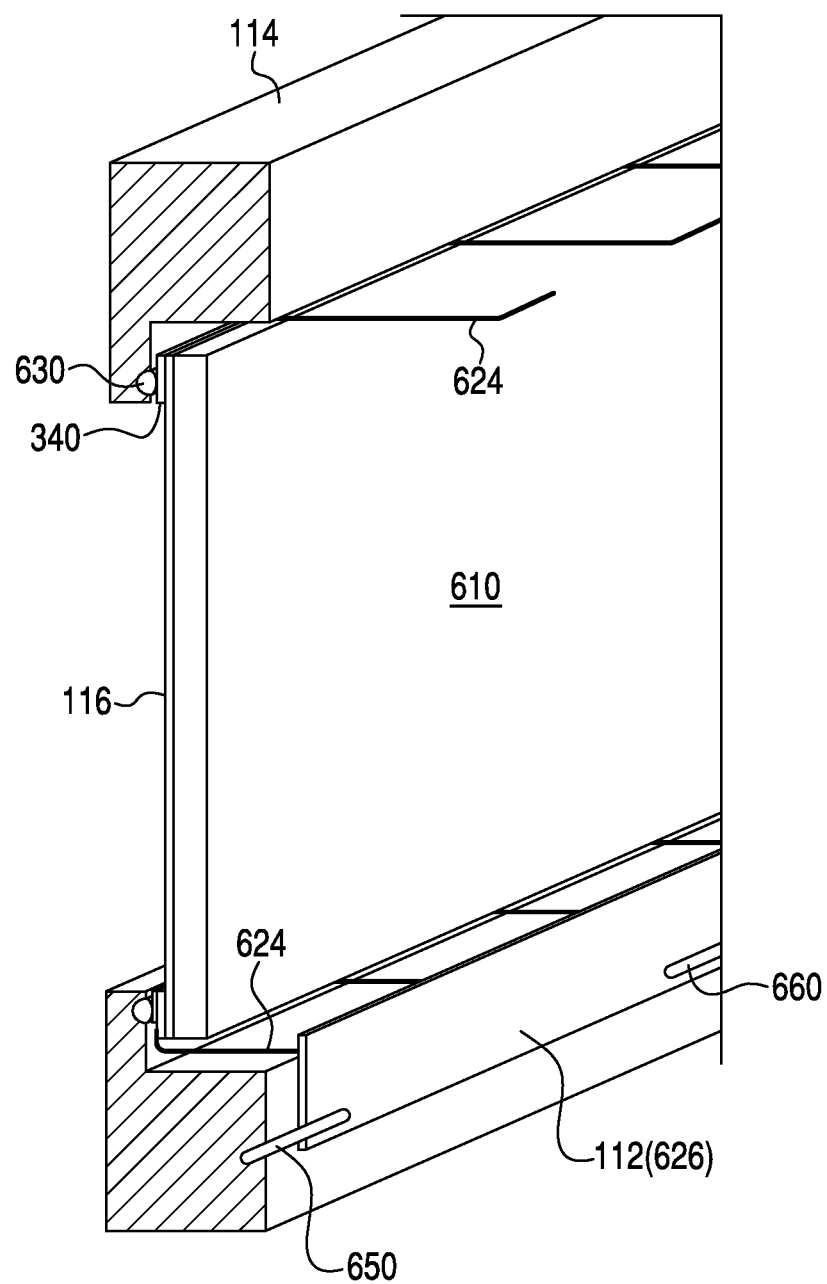

Each of the cells 330 is shown with equivalent resistances connecting to vertically and horizontally adjacent cells. As shown in FIG. 5, there are three or four equivalent resistances for each of the cells 330, depending on whether the cell is an internal cell or a peripheral cell. The diagonal equivalent resistances will be slightly higher than those shown horizontally and vertically. Other cell arrangements will produce different equivalent circuit models. FIG. 6 illustrates a cutaway portion of the EMI shield and heater assembly 110, and a controller 112, according to inventive concepts disclosed herein. The EMI shield and heater assembly 110 may include an electrically conductive chassis 114 and a conductive layer 116. The conductive layer 116 may be supported on a transparent plate (substrate) 610. The transparent plate (substrate) could be formed of glass, sapphire, plastic, or germanium, depending on the electromagnetic radiation of interest to pass through the transparent plate (substrate) 610.

The busbar 340 contacts the conductive layer 116 at the second group of cells, but does not contact the conductive layer 116 at the first group of cells. The busbar may be electrically bonded (connected to provide low electrical resistance) to the conductive layer 116; the busbar may be, and typically is, a conductive material, such as silver, gold, or tin, that is plated onto the conductive thin film, and over the insulator for the first group of cells, around the periphery of the thin conductive coating. The busbar 340 may electrically contact the electrically conductive chassis 114 via an electrically conductive gasket 630, for example a silicone O-ring filled with silver plated glass beads, or a tin plated beryllium copper spiral embedding a silicone O-ring. The busbar 340 may be cut into busbar sections 343 to isolate it from the rest of the busbar. The cut 341 in the busbar 340, in combination with insulating region 342 between the busbar section 343 and the conductive gasket 630, will allow the busbar section 343 to be isolated from chassis 114.

The controller 112 may be implemented on a circuit board 626 as shown. The voltage outputs of the controller 112 are connected to wires 624, which electrically connect to the first group of perimeter cells of the conductive layer 116. The circuit board 626 may be bonded to the electrically conductive chassis 114. The EMI shield and heater assembly 110 may include wire bundles 650 and 660, where the wire bundle 650 on the left side in FIG. 6 comprises some of the wires 624, and the wire bundle 660 on the right side in FIG. 6 comprises other of the wires 624. The wires 624 contained in bundles 650 and 660 may electrically connect directly to the first group of perimeter cells of the conductive layer 116 on the top and sides, or may route through small circuit board assemblies placed near the periphery of the substrate 610 or conductive layer 116 to provide for connection of capacitors 344 to input lines 310 and electrical bonding to the chassis 114.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A device, comprising:
   a controller arranged to receive a power input and having a plurality of voltage outputs; and
   an electromagnetic interference (EMI) shield and heater assembly, comprising:
   a conductive layer divided into a plurality of cells, the cells connected to adjacent cells via conductive layer material and having a cut in the conductive layer material between adjacent cells, the plurality of cells including a first group of cells and a second group of cells in an outer peripheral region of the conductive layer, the plurality of cells including an inner group of cells in an inner region of the conductive layer within the outer peripheral region, the inner group of cells connected to adjacent cells of the first group and the second group via the conductive layer material, wherein the first group, second group, and inner group of cells are arranged in a same plane, wherein the cells are arranged in a rectangular array and have a square shape with a side length L, and the length of the longest non-conductive discontinuity of the conductive layer due to the cuts is about 1.5 times L;
   a plurality of conductive input lines connected to respective of the voltage outputs and electrically contacting only the first group of cells, the controller configured to provide respective voltages to the first group of cells to heat regions of the conductive layer;
   an electrically conducting chassis electrically connected to the second group of cells, and electrically separated from the first group of cells via one of an insulating solid material or an air gap, where none of the cells in the first group of cells are adjacent to each other.

2. The device of claim 1, wherein the electrically conducting chassis is electrically connected to the second group of cells via a busbar.

3. The device of claim 1, wherein the cells are arranged to have different shapes or sizes.

4. The device of claim 1, further comprising a plurality of bypass capacitors, each of the bypass capacitors connected between the electrically conducting chassis and a respective of the conductive input lines.

5. The device of claim 1, further comprising:
   one or more temperature sensors arranged to measure the temperature of respective regions of the device, wherein the controller is configured to provide respective voltages to the first group of cells to heat regions of the conductive layer based on the temperatures measured by the one or more temperature sensors.

6. The device of claim 5, wherein the controller is configured to provide respective time varying voltages and impedances to the first group of cells to heat regions of the conductive layer.

7. The device of claim 1, wherein the conductive layer comprises one of a thin film layer or a mesh layer.

8. An electronic device, comprising:
   electronic components;
   a controller arranged to receive a power input and having a plurality of voltage outputs; and
   an electromagnetic interference (EMI) shield and heater assembly, comprising:
   a conductive layer, adjacent the electronic components, and divided into a plurality of cells, the cells connected to adjacent cells via conductive layer material and having a cut in the material between adjacent cells, the plurality of cells including a first group of cells and a second group of cells in an outer peripheral region of the conductive layer, the plurality of cells including an inner group of cells in an inner region of the conductive layer within the outer peripheral region, the inner group of cells connected to adjacent cells of the first group and the second group via the conductive layer material, wherein the first group, second group, and inner group of cells are arranged in a same plane, wherein the cells are arranged in a rectangular array and have a square shape with a side length L, and the length of the longest non-conductive discontinuity of the conductive layer due to the cuts is about 1.5 times L;
   a plurality of conductive input lines connected to respective of the voltage outputs and electrically contacting only the first group of cells, the controller configured to provide respective voltages to the first group of cells to heat regions of the conductive layer; and
   an electrically conducting chassis electrically connected to the second group of cells, and electrically separated from the first group of cells via one of an insulating solid material or an air gap, where none of the cells in the first group of cells are adjacent to each other.

9. The electronic device of claim 8, wherein the electronic device is one of a display or a vision sensor.

10. The electronic device of claim 8, wherein the electrical components are arranged within an enclosure provided by the conductive layer and the electrically conducting chassis, the enclosure surrounding the electrical components.

11. The electronic device of claim 10, further comprising optical components arranged within the enclosure provided by the conductive layer and the electrically conducting chassis.

12. The electronic device of claim 9, further comprising:
   one or more temperature sensors arranged to measure the temperature of respective regions of the device, wherein the controller is configured to provide respective voltages to the first group of cells to heat regions of the conductive layer based on the temperatures measured by the one or more temperature sensors.

13. The device of claim 12, wherein the controller is configured to provide respective time varying voltages and impedances to the first group of cells to heat regions of the conductive layer.

14. The electronic device of claim 9, wherein the conductive layer comprises one of a thin film layer or a mesh layer.

15. A device, comprising:
- a controller arranged to receive a power input and having a plurality of voltage outputs; and
- a heater, comprising:
  - a conductive layer divided into a plurality of cells, the cells connected to adjacent cells via conductive layer material;
  - a plurality of conductive input lines connected to respective of the voltage outputs and electrically contacting cells in an outer peripheral region of the conductive layer, the controller configured to provide respective voltages to a first group of cells of the cells in the outer peripheral region to heat regions of the conductive layer, the plurality of cells including an inner group of cells in an inner region of the conductive layer within the outer peripheral region, the inner group of cells connected to adjacent cells of the first group via the conductive layer material, wherein the first group and inner group of cells are arranged in a same plane, wherein the cells are arranged in a rectangular array and have a square shape with a side length L, and the length of the longest non-conductive discontinuity of the conductive layer due to the cuts is about 1.5 times L.

16. The device of claim 15, wherein the cells are arranged to have different shapes or sizes.

17. The device of claim 15, wherein the conductive layer comprises one of indium tin oxide (ITO), gold splatter, or silver.

18. The device of claim 15, further comprising:
- one or more temperature sensors arranged to measure the temperature of respective regions of the device, wherein the controller is configured to provide respective voltages to the first group of cells to heat regions of the conductive layer based on the temperatures measured by the one or more temperature sensors.

19. The device of claim 15, wherein the conductive layer comprises one of a thin film layer or a mesh layer.

* * * * *